US011508625B2

(12) United States Patent
Fulford et al.

(10) Patent No.: US 11,508,625 B2
(45) Date of Patent: Nov. 22, 2022

(54) METHOD OF MAKING A CONTINUOUS CHANNEL BETWEEN 3D CMOS

(71) Applicant: TOKYO ELECTRON LIMITED, Tokyo (JP)

(72) Inventors: H. Jim Fulford, Marianna, FL (US); Mark I. Gardner, Cedar Creek, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 90 days.

(21) Appl. No.: 17/123,987

(22) Filed: Dec. 16, 2020

(65) Prior Publication Data
US 2021/0217666 A1 Jul. 15, 2021

Related U.S. Application Data

(60) Provisional application No. 62/960,794, filed on Jan. 14, 2020.

(51) Int. Cl.
*H01L 21/8238* (2006.01)
*H01L 27/092* (2006.01)
(Continued)

(52) U.S. Cl.
CPC ......... *H01L 21/823807* (2013.01); *H01L 21/02603* (2013.01); *H01L 21/28518* (2013.01);
(Continued)

(58) Field of Classification Search
CPC ....... H01L 21/823807; H01L 21/02603; H01L 21/28518; H01L 21/823814; H01L 27/092;
(Continued)

(56) References Cited

U.S. PATENT DOCUMENTS 7,504,336 B2   3/2009  Purtell et al.
9,997,414 B2   6/2018  Glass et al.
(Continued)

FOREIGN PATENT DOCUMENTS

JP       2007-311796 A    11/2007
KR   10-2018-0021118 A     2/2018

OTHER PUBLICATIONS

International Search Report and Written Opinion dated Apr. 21, 2021 in PCT/US2020065849, 8 pages.

*Primary Examiner* — Tong-Ho Kim
(74) *Attorney, Agent, or Firm* — Oblon, McClelland, Maier & Neustadt, L.L.P.

(57) ABSTRACT

A semiconductor device includes a first n-type transistor and a first p-type transistor that are positioned side by side over a substrate. The first n-type transistor includes a first n-type source/drain (S/D) region, a first n-type channel region, and a second n-type S/D region that are formed based on a first continuous channel structure extending along a horizontal direction parallel to the substrate. The first n-type channel region is positioned between the first n-type S/D region and the second n-type S/D region. The first p-type transistor includes a first p-type S/D region, a first p-type channel region, and a second p-type S/D region that are formed based on the first continuous channel structure. The first p-type channel region is positioned between the first p-type S/D region and the second p-type S/D region. The second n-type S/D region is in contact with the first p-type S/D region.

18 Claims, 15 Drawing Sheets

(51) Int. Cl.
| | |
|---|---|
| *H01L 29/06* | (2006.01) |
| *H01L 29/423* | (2006.01) |
| *H01L 29/45* | (2006.01) |
| *H01L 29/786* | (2006.01) |
| *H01L 21/02* | (2006.01) |
| *H01L 21/285* | (2006.01) |
| *H01L 29/66* | (2006.01) |

(52) U.S. Cl.
CPC .... *H01L 21/823814* (2013.01); *H01L 27/092* (2013.01); *H01L 29/0673* (2013.01); *H01L 29/42392* (2013.01); *H01L 29/45* (2013.01); *H01L 29/66742* (2013.01); *H01L 29/78618* (2013.01); *H01L 29/78696* (2013.01)

(58) Field of Classification Search
CPC ........... H01L 29/0673; H01L 29/42392; H01L 29/45; H01L 29/66742; H01L 29/78618; H01L 29/78696; H01L 21/8221; H01L 27/0688

USPC ........................................................ 257/351
See application file for complete search history.

(56) References Cited

U.S. PATENT DOCUMENTS

| | | | |
|---|---|---|---|
| 10,217,842 B2 | 2/2019 | Reboh et al. | |
| 10,249,740 B2 | 4/2019 | Rachmady et al. | |
| 10,263,100 B1 | 4/2019 | Bi et al. | |
| 10,483,287 B1* | 11/2019 | Li | H01L 29/7869 |
| 10,930,766 B2 | 2/2021 | Rachmady et al. | |
| 2007/0269970 A1 | 11/2007 | Purtell et al. | |
| 2016/0104771 A1* | 4/2016 | Aderhold | H01L 29/42392 257/369 |
| 2017/0162447 A1 | 6/2017 | Glass et al. | |
| 2018/0138289 A1 | 5/2018 | Rachmady et al. | |
| 2018/0175167 A1 | 6/2018 | Reboh et al. | |
| 2019/0165171 A1* | 5/2019 | Huang | H01L 21/76897 |
| 2019/0189770 A1 | 6/2019 | Rachmady et al. | |
| 2021/0104522 A1* | 4/2021 | Gardner | H01L 21/8221 |

* cited by examiner

# METHOD OF MAKING A CONTINUOUS CHANNEL BETWEEN 3D CMOS

INCORPORATION BY REFERENCE

This present application claims the benefit of priority to U.S. Provisional Application No. 62/960,794, "METHOD OF MAKING A CONTINUOUS CHANNEL BETWEEN 3D CMOS" filed on Jan. 14, 2020, which is incorporated by reference herein in its entirety.

FIELD OF THE INVENTION

The disclosure relates to integrated circuits and the fabrication of microelectronic devices.

BACKGROUND

In the manufacture of a semiconductor device (especially on the microscopic scale), various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

SUMMARY 3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e., the vertical stacking of multiple devices, aims to overcome these scaling limitations by increasing transistor density in volume rather than area. This idea has been successfully demonstrated and implemented by the flash memory industry with the adoption of 3D NAND. Mainstream CMOS VLSI scaling, as used for example in CPU or GPU products, is exploring adoption of 3D integration as a primary means of moving the semiconductor roadmap forward, and thus desires enabling technologies.

Techniques herein provide methods for making a continuous channel between 3D CMOS devices. A reduced 3D layout size is enabled herein because a connection space is reduced using a continuous channel. Another benefit is that all transistors can be used in 3D stacks herein. Buried power rail (power rail positioned below devices or in bulk silicon) can be integrated with embodiments herein. Embodiments can include stacks of multiple CMOS planes, with N planes selectable. By having combinations of 3D continuous channel and 3D cut channel, optimum 3D logic can be achieved.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a first transistor pair formed over a substrate. The first transistor pair can include a first n-type transistor and a first p-type transistor that are arranged along a horizontal direction parallel to the substrate and are positioned side by side. The first n-type transistor can include a first n-type source/drain (S/D) region, a first n-type channel region, and a second n-type S/D region that are formed based on a first continuous channel structure extending in the horizontal direction and coupled to each other, where the first n-type channel region can be positioned between the first n-type S/D region and the second n-type S/D region. The first p-type transistor can include a first p-type S/D region, a first p-type channel region, and a second p-type S/D region that are formed based on the first continuous channel structure extending in the horizontal direction and coupled to each other, where the first p-type channel region can be positioned between the first p-type S/D region and the second p-type S/D region. The second n-type S/D region of the first n-type transistor can be in contact with the first p-type S/D region of the first p-type transistor.

In some embodiments, the first n-type S/D region can be positioned in a first portion of the first continuous channel structure. The first n-type channel region can be positioned in a second portion of the first continuous channel structure that is adjacent to the first portion of the first continuous channel structure. The second n-type S/D region can be positioned in a third portion of the first continuous channel structure that is adjacent to the second portion of the first continuous channel structure. The first p-type S/D region can be positioned in a fourth portion of the first continuous channel structure that is adjacent to the third portion of the first continuous channel structure. The first p-type channel region can be positioned in a fifth portion of the first continuous channel structure that is adjacent to the fourth portion of the first continuous channel structure. The second p-type S/D region can be positioned in a sixth portion of the first continuous channel structure that is adjacent to the fifth portion of the first continuous channel structure.

In an embodiment, the first n-type S/D region can include n-type dopants disposed at a surface region of the first portion of the first continuous channel structure. The second n-type S/D region can include n-type dopants disposed at a surface region of the third portion of the first continuous channel structure. The first p-type S/D region can include p-type dopants disposed at a surface region of the fourth portion of the first continuous channel structure. The second p-type S/D region can include p-type dopants disposed at a surface region of the sixth portion of the first continuous channel structure.

In another embodiment, the first n-type S/D region can include n-type dopants extending through the first portion of the first continuous channel structure. The second n-type S/D region can include n-type dopants extending through the third portion of the first continuous channel structure. The first p-type S/D region can include p-type dopants extending through the fourth portion of the first continuous channel structure. The second p-type S/D region can include p-type dopants extending through the sixth portion of the first continuous channel structure.

The semiconductor device can include a metal silicide layer that surrounds the first n-type S/D region, the second n-type S/D region and, the first p-type S/D region, and the second p-type S/D region.

In some embodiments, the first n-type channel region can include one of a nanowire and a nanosheet that is arranged along the horizontal direction and extends through the first n-type transistor and the first p-type transistor.

In the semiconductor device, the first n-type transistor can further include a first n-type gate layer that surrounds the first n-type channel region. In addition, the first p-type transistor can further include a first p-type gate layer that surrounds the first p-type channel region.

The semiconductor device can include a dielectric layer that is positioned over the substrate and surrounds the second n-type S/D region of the first n-type transistor and the first p-type S/D region of the first p-type transistor.

The semiconductor device can also include a first spacer that extends along a vertical direction perpendicular to the substrate and surrounds the first n-type S/D region, a second spacer that extends along the vertical direction and surrounds the second n-type S/D region, a third spacer that extends along the vertical direction and surrounds the first p-type S/D region, and a fourth spacer that extends along the vertical direction, and surrounds the second p-type S/D region.

In some embodiments, the semiconductor device can include a second transistor pair that is stacked over the first transistor pair. The second transistor pair can include a second n-type transistor and a second p-type transistor that are arranged in the horizontal direction and are positioned side by side. The second n-type transistor can include a third n-type S/D region, a second n-type channel region, and a fourth n-type S/D region that are formed based on a second continuous channel structure extending in the horizontal direction and coupled to each other, where the second n-type channel region can be positioned between the third n-type S/D region and the fourth n-type S/D region. The second p-type transistor can include a third p-type S/D region, a second p-type channel region, and a fourth p-type S/D region that are formed based on the second continuous channel structure extending in the horizontal direction and coupled to each other, where the second p-type channel region can be positioned between the third p-type S/D region and the fourth p-type S/D region. Further, the fourth n-type S/D region of the second n-type transistor can be in contact with the third p-type S/D region of the second p-type transistor.

In some embodiments, the third n-type S/D region can be positioned in a first portion of the second continuous channel structure. The second n-type channel region can be positioned in a second portion of the second continuous channel structure that is adjacent to the first portion of the second continuous channel structure. The fourth n-type S/D region can be positioned in a third portion of the second continuous channel structure that is adjacent to the second portion of the second continuous channel structure. The third p-type S/D region can be positioned in a fourth portion of the second continuous channel structure that is adjacent to the third portion of the second continuous channel structure. The second p-type channel region can be positioned in a fifth portion of the second continuous channel structure that is adjacent to the fourth portion of the second continuous channel structure. The fourth p-type S/D region can be positioned in a sixth portion of the second continuous channel structure that is adjacent to the fifth portion of the second continuous channel structure.

In some embodiments, the first spacer can further be disposed between the first n-type S/D region and the third n-type S/D region, and surrounds the third n-type S/D region. The second spacer can further be disposed between the second n-type S/D region and the fourth n-type S/D region, and surrounds the fourth n-type S/D region. The third spacer can further be disposed between the first p-type S/D region and the third p-type S/D region, and surrounds the third p-type S/D region. The fourth spacer can further be disposed between the second p-type S/D region and the fourth p-type S/D region, and surrounds the fourth p-type S/D region.

According to another aspect of the disclosure, a method of forming a semiconductor device is provided. In the method, a semiconductor structure can be formed over a substrate. The semiconductor structure can include a first n-type transistor and a first p-type transistor that are arranged along a horizontal direction parallel to the substrate and are positioned side by side. The first n-type transistor can include a first n-type future S/D region, a first n-type channel region, and a second n-type future S/D region that are formed based on a first continuous channel structure extending in the horizontal direction sequentially so that the first n-type channel region is positioned between the first n-type future S/D region and the second n-type future S/D region. The first p-type transistor can include a first p-type future S/D region, a first p-type channel region, and a second p-type future S/D region that are formed based on the first continuous channel structure extending in the horizontal direction sequentially so that the first p-type channel region is positioned between the first p-type future S/D region and the second p-type future S/D region. The second n-type future S/D region can be in contact with the first p-type future S/D region.

Subsequently, a N+ material can be grown around the first n-type future S/D region and the second n-type future S/D region to form a first n-type S/D region and a second n-type S/D region respectively. Further, a P+ material can be grown around the first p-type future S/D region and the second p-type future S/D region to form a first p-type S/D region and a second p-type S/D region respectively, where the second n-type S/D region can be in contact with the first p-type S/D region.

In order to grow the N+ material, a first dielectric layer can be formed to cover the second n-type future S/D region of the first n-type transistor and the first p-type future S/D region of the first p-type transistor. A second dielectric layer can be formed to cover the first dielectric layer. A mask layer can subsequently be formed to cover the first p-type transistor, and a first section of the first dielectric layer and a first section of the second dielectric layer that are disposed over the first p-type future S/D region. A second section of the first dielectric layer and a second section of the second dielectric layer that are positioned over the second n-type future S/D region can then be removed to uncover the second n-type future S/D region. The N+ material can subsequently be grown around the second n-type future S/D region to form the second n-type S/D region.

In some embodiments, in order to grown the P+ material, a third dielectric layer can be formed to cover the second n-type S/D region. Further, a mask layer can be formed to cover the first n-type transistor and the third dielectric layer so that the first section of the second dielectric layer is uncovered. The first section of the second dielectric layer and the first section of the first dielectric layer can be removed to uncover the first p-type future S/D region. The P+ material can then be grown around the first p-type future S/D region to form the first p-type S/D region.

In the method, a metal silicide layer can further be formed to surround the first n-type S/D region, the second n-type S/D region and, the first p-type S/D region, and the second p-type S/D region.

In some embodiments, a second n-type transistor and a second p-type transistor can be formed over the first n-type transistor and the first p-type transistor. The second n-type transistor and the second p-type transistor can be arrange along the horizontal direction and are positioned side by side. The second n-type transistor can includes a third n-type future S/D region, a second n-type channel region, and a fourth n-type future S/D region that are formed based on a second continuous channel structure extending in the horizontal direction sequentially so that the second n-type channel region is positioned between the third n-type future S/D region and the fourth n-type future S/D region. The second p-type transistor can include a third p-type future S/D region, a second p-type channel region, and a fourth p-type future S/D region that are formed based on the second continuous channel structure along the horizontal direction sequentially so that the second p-type channel region can be positioned between the third p-type future S/D region and the fourth p-type future S/D region.

The N+ material can be subsequently formed around the third n-type future S/D region and the fourth n-type future S/D region to form a third n-type S/D region and a fourth n-type S/D region respectively. In addition, the P+ material can be formed around the third p-type future S/D region and the fourth p-type future S/D region to form a third p-type S/D region and a fourth p-type S/D region respectively, where the fourth n-type S/D region being in contact with the third p-type S/D region.

According to yet another aspect of the disclosure, a semiconductor device is provided. The semiconductor device can include a stack of NMOS transistor devices that are positioned over a substrate in a vertical direction perpendicular to the substrate, and spaced apart from one another. A first NMOS transistor device of the stack of NMOS transistor devices can include a first n-type source/drain (S/D) region, a first n-type channel region, and a second n-type S/D region that are formed based on a first continuous channel structure extending in a horizontal direction parallel to the substrate. The first n-type channel region can be positioned between the first n-type S/D region and the second n-type S/D region.

The semiconductor device can include a stack of PMOS transistor devices that are positioned over the substrate in the vertical direction, and spaced apart from one another. A first PMOS transistor device of the stack of PMOS transistor devices can include a first p-type source/drain (S/D) region, a first p-type channel region, and a second p-type S/D region that are formed based on the first continuous channel structure extending in the horizontal direction. The first p-type channel region can be positioned between the first p-type S/D region and the second p-type S/D region. In addition, the stack of NMOS transistor devices are positioned adjacent to the stack of PMOS transistor devices, and the second n-type S/D region is in contact with the first p-type S/D region.

In some embodiments, the stack of NMOS transistor devices can include a second NMOS transistor device that is positioned over the first NMOS transistor device. The stack of PMOS transistor devices can further include a second PMOS transistor device that is positioned over the first PMOS transistor device. The second NMOS transistor device can include a third n-type S/D region, a second n-type channel region, and a fourth n-type S/D region that are formed based on a second continuous channel structure extending in the horizontal direction. The second n-type channel region can be positioned between the third n-type S/D region and the fourth n-type S/D region. The second PMOS transistor device can include a third p-type S/D region, a second p-type channel region, and a fourth p-type S/D region that are formed based on the second continuous channel structure extending in the horizontal direction sequentially, where the second p-type channel region can be positioned between the third p-type S/D region and the fourth p-type S/D region. In addition, the fourth n-type S/D region of the second NMOS transistor device can be in contact with the third p-type S/D region of the second PMOS transistor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
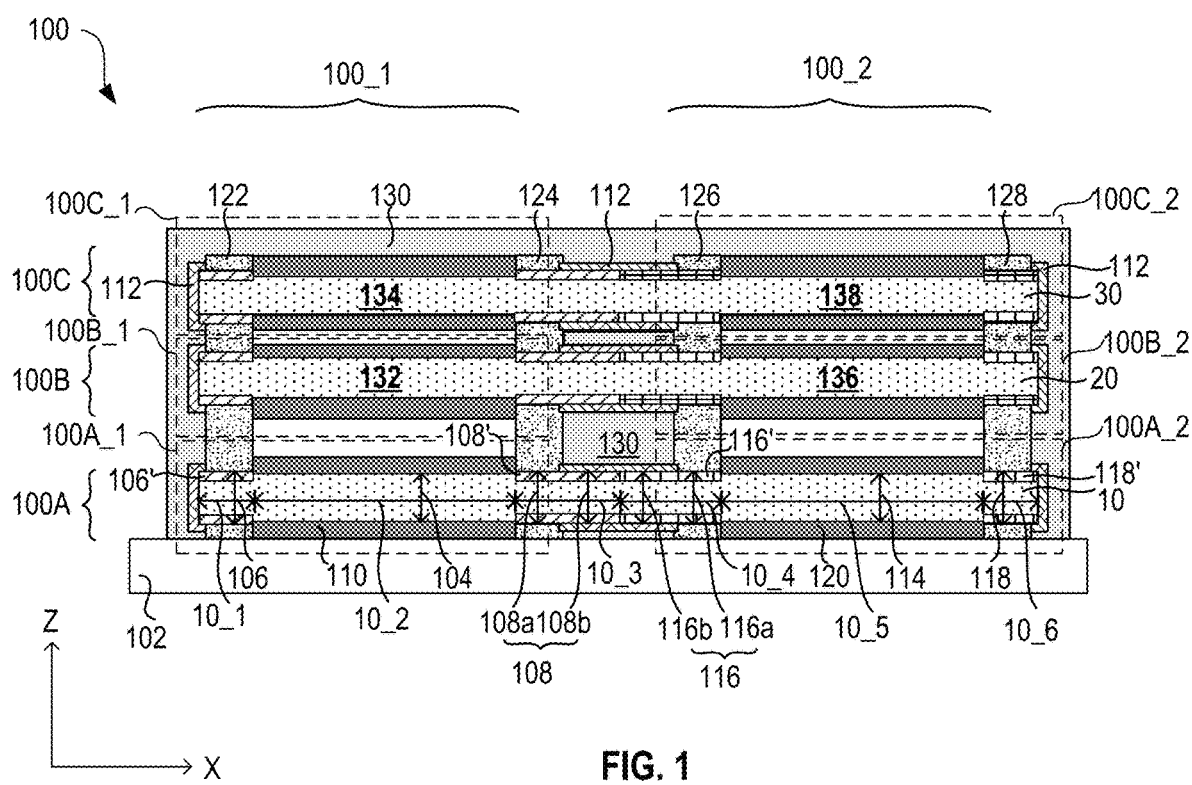
FIG. 1 is a cross-sectional view of a first CFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein provide methods for making a continuous channel between 3D CMOS devices. The methods include forming continuous channels between side-by-side field effect transistors (FETs). A continuous channel between a NMOS transistor and a PMOS transistor in a side-by-side configuration can eliminate one connection by shorting the N+ and P+ source/drain (S/D) of the NMOS transistor and the PMOS transistor. Accordingly a more efficient layout can be enabled. In addition, increased S/D areas can be achieved in continuous channel regions. By having combinations of 3D continuous channel and 3D cut channel, optimum 3D logic functions can be achieved.

FIG. 1 shows an exemplary embodiment of CFET device 100 (or device 100) that includes a stack of NMOS transistors (or NMOS transistor devices, or n-type transistors) 100_1 and a stack of PMOS transistors (or PMOS transistor devices, or p-type transistors) 100_2 that are positioned side by side over a substrate 102 and are coupled to each other through continuous channels 10, 20 and 30. The method of forming the CFET device 100 can include forming power rails in bulk silicon (e.g., substrate 102), and then forming a stack of nanoplanes (or layers). The stack of layers can be alternating layers of epitaxially grown materials. Etch masks can be used to segment the stack(s) and form fin structures in the stack of nanoplanes (or layers) that are formed of various materials. The channel material (or channel structures, or channel regions) of the CFET device 100 can be formed of conventional semiconductor materials and can include doped materials. Detailed intermediate steps of manufacturing the CFET device 100 can be illustrated in FIGS. 2-16.

Still referring to FIG. 1, the stack of NMOS transistors 100_1 (or stack 100_1) can include a plurality of n-type transistors (or NMOS transistor devices) that are arranged over the substrate 102 in a vertical direction (e.g., Z direction) perpendicular to the substrate 102. For simplicity and clarity, three n-type transistors 100A_1, 100B_1, and 100C_1 are included in FIG. 1. Of course, the stack 100_1 can include any number of n-type transistors. The n-type transistors can be spaced apart from one another by a first spacer 122 and a second spacer 124. Further, the stack 100_1 can be disposed in a dielectric layer 130 that is formed over the substrate 102. In the stack 100_1, the n-type transistors can include first n-type source/drain (S/D) regions, n-type channel regions, and second n-type S/D regions that are formed based on the continuous channels 10, 20 and 30, arranged sequentially along a horizontal direction (e.g., X direction) parallel to the substrate 102, and coupled to each other. For example, the n-type transistor 100A_1 can include a first n-type S/D region 106, a n-type channel region 104, and a second n-type S/D region 108 that are formed based on the continuous channel 10, arranged sequentially along the horizontal direction and coupled to each other, where the n-type channel region 104 is positioned between the first n-type S/D region 106 and the second n-type S/D region 108.

The first n-type S/D regions can be positioned in first portions of the continuous channels. The first n-type channel regions can be positioned in second portions of the continuous channels that are adjacent to the first portions of the continuous channels. The second n-type S/D regions can be positioned in third portions of the continuous channels that are adjacent to the second portions of the continuous channels. For example, the first n-type S/D region 106 can be formed in a first portion 10_1 of the continuous channel 10 that is covered by the first spacer 122. The first n-type channel region 104 can be positioned in a second portion 10_2 of the continuous channel 10 that is adjacent to the first portion 10_1. The second n-type S/D region 108 can be positioned in a third portion 10_3 of the continuous channel 10 that is covered by the second spacer 124 and arranged adjacent to the second portion 10_2.

In some embodiments, the first n-type S/D regions can include n-type doped regions that are disposed at surface regions of the first portions of the continuous channels. The second n-type S/D regions can include n-type doped regions disposed at surface regions of the third portions of the continuous channels. For example, the first n-type S/D region 106 can include a n-type doped region 106' disposed at a surface region of the first portion 10_1 of the continuous channel 10. The second n-type S/D region 108 can include a n-type doped region 108' disposed at a surface region of the third portion 10_3 of the continuous channel 10.

In some embodiments, the substrate 102 can be a semiconductor substrate such as silicon (Si) substrate. The substrate 102 can also include other semiconductors such as germanium (Ge), silicon carbide (SiC), silicon germanium (SiGe), or diamond. Alternately, the substrate 102 can include a compound semiconductor and/or an alloy semiconductor. The continuous channels 10, 20 and 30 can be nanowires or nanosheets and made of Si, SiGe, SiC, or other suitable semiconductor materials. The n-type doped regions (e.g., 106' and 108') can be N+ epitaxial layers that are heavily doped with n-type dopant, such as phosphorous. The first spacer 122, the second spacer 124 and the dielectric layer 130 can be oxide, nitride or low-K materials, such as SiO, SiN, SiCN, SiOC, SiCOH, or other suitable dielectric materials.

It should be noted that each of the second n-type S/D regions can include a first portion and a second portion. The first portion can be in direct contact with the n-type channel region and covered by a spacer. The second portion can extend in the horizontal direction and function as a n-type connection region. For example, the second n-type S/D region 108 can include a first portion 108a and a second portion 108b. The first portion 108a can be in direct contact with the n-type channel region 104 and covered by second spacer 124. The second portion 108b can function as a n-type connection region that is in contact with adjacent components, such as an adjacent p-type transistor.

The n-type transistors can also include gate regions that surround the channel regions. For example, the n-type transistor 100A_1 can include a gate region 110 that surrounds the n-type channel region 104. The gate region can include multiple layers that can include a barrier layer (e.g., SiO), a high-K layer (e.g., HfO), and work function layers (e.g., AlTiC and AlTiO). In a gate last process flow, the gate region 110 can be a future gate region that is made of oxide or nitride, and can further be replaced with the barrier layer, the high-K layer, and the work function layers to form a functional gate region when high temperature process steps are completed.

The stack of PMOS transistors 100_2 (or stack 100_2) can include a plurality of p-type transistors (or PMOS transistor device) that is arranged over the substrate 102 in the vertical direction (e.g., Z direction). For simplicity and clarity, three p-type transistors 100A_2, 100B_2, and 100C_2 are included in FIG. 1. Of course, the stack 100_2 can include any number of p-type transistors. The p-type transistors are spaced apart from one another by a third spacer 126 and a fourth spacer 128. Further, the stack 100_2 can also be disposed in the dielectric layer 130. In the stack 100_2, the p-type transistors can include first p-type S/D regions, p-type channel regions, and second p-type S/D regions that are formed based on the continuous channels 10, 20 and 30, arranged sequentially along the horizontal direction (e.g., X direction), and coupled to each other. For example, the p-type transistor 100A_2 can include a first p-type S/D region 116, a p-type channel region 114, and a second p-type S/D region 118 that are formed based on the continuous channel 10, and arranged sequentially along the horizontal direction and coupled to each other, where the p-type channel region 114 is positioned between the first p-type S/D region 116 and the second p-type S/D region 118.

The first p-type S/D regions can be positioned in fourth portions of the continuous channels. The first p-type channel regions can be positioned in fifth portions of the continuous channels that are adjacent to the fourth portions of the continuous channels. The second p-type S/D regions can be positioned in sixth portions of the continuous channels that are adjacent to the fifth portions of the continuous channels. For example, the first p-type S/D region 116 can be formed in a fourth portion 10_4 of the continuous channel 10 and covered by the third spacer 126. The first p-type channel region 114 can be positioned in a fifth portion 10_5 of the continuous channel 10. The second p-type S/D region 118 can be positioned in a sixth portion 10_6 of the continuous channel 10 and covered by the fourth spacer 128.

In some embodiments, the first p-type S/D regions can include p-type doped regions that are disposed at surface regions of the fourth portions of the continuous channels. The second p-type S/D regions can include p-type doped regions disposed at surface regions of the sixth portions of the continuous channels. For example, the first p-type S/D region 116 can include a p-type doped region 116' disposed at a surface region of the fourth portion 10_4 of the continuous channel 10. The second p-type S/D region 118 can include a p-type doped region 118' disposed at a surface region of the sixth portion 10_6 of the continuous channel 10.

In some embodiments, the p-type doped regions (e.g., 116' and 118') can be P+ epitaxial layers that are heavily doped with p-type dopant, such as boron. The third spacer 126 and the fourth spacer 128 can be oxide, nitride or low-K materials, such as SiO, SiN, SiCN, SiOC, SiCOH, or other suitable dielectric materials.

It should be noted that each of the first p-type S/D regions can include a first portion and a second portion. The first portion can be in direct contact with the p-type channel region and covered by a spacer. The second portion can extend in the horizontal direction and function as a p-type connection region. The second portion of the first p-type S/D region (or p-type connection region) can be in direct contact with the n-type connection region. For example, the first S/D region 116 of the p-type transistor 100A_2 can include a first portion 116a and a second portion 116b. The first portion 116a can be in direct contact with the p-type channel region 114 and covered by the third spacer 126. The second portion 116b can function as a p-type connection region 116b that is in direct contact with the n-type connection region 108b. Thus, the second n-type S/D region 108 of the n-type transistor 100A_1 can be coupled to the first p-type S/D region 116 of the p-type transistor 100A_2. Note, however, that first n-type channel region 104 and the first p-type channel-region 114 are part of the same continuous channel 10. That is, both channel regions 104 and 114 are formed from a same nano-sheet or nanowire that is uncut.

The p-type transistors can also include gate regions that surround the p-type channel regions. For example, the p-type transistor 100A_2 can include a gate region 120 that surrounds the p-type channel region 114. The gate regions (e.g., gate regions 120) can include multiple layers that can include a barrier layer (e.g., SiO), a high-K layer (e.g., HfO), and work function layers (e.g., AlTiN, AlTiC and AlTiO). In a gate last process flow, the gate regions can be future gate regions that are made of oxide or nitride. The gate regions can further be replaced with the barrier layer, the high-K layer, and the work function layers to form functional gate regions when high temperature process steps are completed.

As shown in FIG. 1, the stack of NMOS transistors 100_1 and the stack of PMOS transistors 100_2 can be arranged side by side over the substrate 102. Accordingly, a plurality of transistor pairs can be formed over the substrate 102, where each of the transistor pairs can include a respective n-type transistor and a respective p-type transistor that are formed based on a same continuous channel. For example, three transistor pairs 100A, 100B, and 100C can be formed over the substrate 102. The transistor pair (or first transistor pair) 100A can include the n-type transistor 100A_1 and the p-type transistor 100A_2 that are formed based on the continuous channel 10. The transistor pair (or second transistor pair) 100B can include the n-type transistor 100B_1 and the p-type transistor 100B_2 that are formed based on the continuous channel 20. The transistor pair (or third transistor pair) 100C can include the n-type transistor 100C_1 and the p-type transistor 100C_2 that are formed based on the continuous channel 30. The stack of NMOS transistors 100_1 and the stack of PMOS transistors 100_2 can be coupled to each other through adjacent n-type S/D regions and p-type S/D regions. Specifically, the stack of NMOS transistors 100_1 and the stack of PMOS transistors 100_2 can be coupled to each other through the n-type connection regions (e.g., 108b) and the p-type connection regions (e.g., 116b) in the adjacent n-type S/D regions and p-type S/D regions. The n-type connection regions (e.g., 108b) and the p-type connection regions (e.g., 116b) can further be coupled to the n-type channels (e.g., 104) and the p-type channels (e.g., 114) respectively.

The CFET device 100 can also include metal silicide layers 112 that are formed to surround the first n-type S/D regions, the second n-type S/D regions, the first p-type S/D regions, and the second p-type S/D regions. The metal silicide layers 112 can be configured to improve conductivity of the S/D regions. For example, the metal silicide layers 112 can be disposed around top surfaces of the first n-type S/D region 106, the second n-type S/D region 108, the first p-type S/D region 116, and the second p-type S/D region 118. In some embodiments, the metal silicide layers 112 can include tungsten silicide, titanium silicide, cobalt silicide, or ruthenium silicide.

Figure 2:
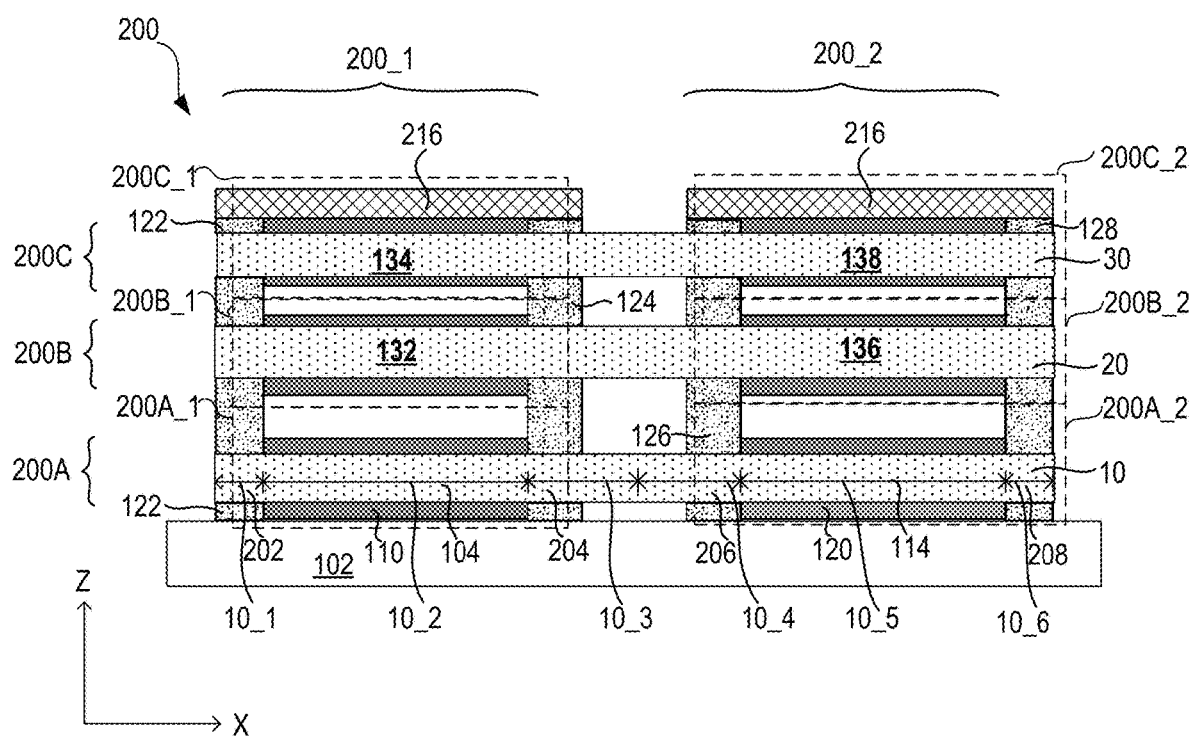
FIGS. 2-16 are cross-sectional views of various exemplary intermediate steps of manufacturing a CFET device, in accordance with some embodiments.

FIGS. 2-16 are cross-sectional views of various exemplary intermediate steps of manufacturing a CFET device. FIG. 2 illustrates formation of stacked gate-all-around, vertically stacked transistors prior to source/drain formation. Note that the silicon nanoplane channel is continuous for the starting point of the process flow between adjacent 3D nanostacks. The example stack transistor combination is strategically made to enable reduced connections for optimum layout of two adjacent 3D CMOS transistors. Embodiments herein can also include a 3D stack of CMOS devices 200 (also referred to as stack 200) that is formed over a substrate 102. The stack 200 can include a stack of NMOS transistors 200_1 (or stack 200_1) and a stack of PMOS transistors 200_2 (or stack 200_2). The stack 200_1 can include a plurality of n-type transistors, such as 200A_1, 200B_1, and 200C_1 that are stacked over the substrate 102 along the vertical direction and spaced apart from one other by a first spacer 122 and a second spacer 124. The stack 200_2 can include a plurality of p-type transistors, such as 200A_2, 200B_2, and 200C_2 that are stacked over the substrate 102 along the vertical direction and spaced apart from one other by a third spacer 126 and a fourth spacer 128. The stack 200_1 and the stack 200_2 can form a plurality of transistor pairs, where each of the transistor pairs can include a respective n-type transistor and a respective p-type transistor. For example, three transistor pairs 200A, 200B and 200C are included in FIG. 2, and the transistor pair 200A can include the n-type transistor 200A_1 and the p-type transistor 200A_2.

In an example, completed device herein can have continuous channels 10, 20 and 30 arranged between transistor pairs 200A_1/200A_2, 200B_1/200B_2, and 200C_1/200C_2. As shown in FIG. 2, the stack 200_1 can have n-type channel regions 104, 132, and 136 on the left side that are positioned in the second portions (e.g., 10_2) of the continuous channels 10-30. The stack 200_2 can also have p-type channel regions 114, 136, and 138 on the right side that are positioned in the fifth portions (e.g., 10_5) of the continuous channels 10-30. Future N+ S/D regions (or n-type future S/D regions), such as 202 and 204, can be included in the stack 200_1 and positioned in the first and third portions (e.g., 10_1 and 10_3) of the continuous channels (e.g., 10-30). Also future P+ S/D regions (or p-type future S/D regions), such as 206 and 208, can be included in the stack 200_2 and positioned in the fourth and sixth portions (e.g., 10_4 and 10_6) of the continuous channel (e.g., 10-30). Inner spacers (e.g., 122, 124, 126 and 128) can help support channel lengths of the continuous channels 10-30. The inner spacers can be formed by removing and replacing a portion of initial layer material in the stack 200. A gate protect material (or gate region, or future gate region) can be deposited on the channel regions for subsequent replacement with metal materials. For example, a gate region 110 can be formed to surround the n-type channel region 104, and a gate region 120 can be formed to surround the p-type channel region 114. A deposition of dielectric material, such as silicon nitride, on a top surface of each stack (e.g., 200_1 or 200_2) can be performed. Accordingly, cap layers 216 can be formed on the top surfaces of the stacks 200_1 and 200_2.

In some embodiments, the continuous channels 10, 20, and 30 can be nanowires or nanosheets that are arranged along the horizontal direction and extend through the NMOS transistors 200_1 and the PMOS transistors 200_2. The continuous channels 10, 20, and 30 can be made of intrinsic semiconductor materials, such as Si, SiGe, SiC, or other suitable semiconductor materials, where the n-type future S/D regions (e.g., 202 and 204), the n-type channel regions (e.g., 104), the p-type future S/D regions (e.g., 206 and 208), and the p-type channel regions (e.g., 114) can be formed based on the continuous channels 10, 20, and 30.

Figure 3:
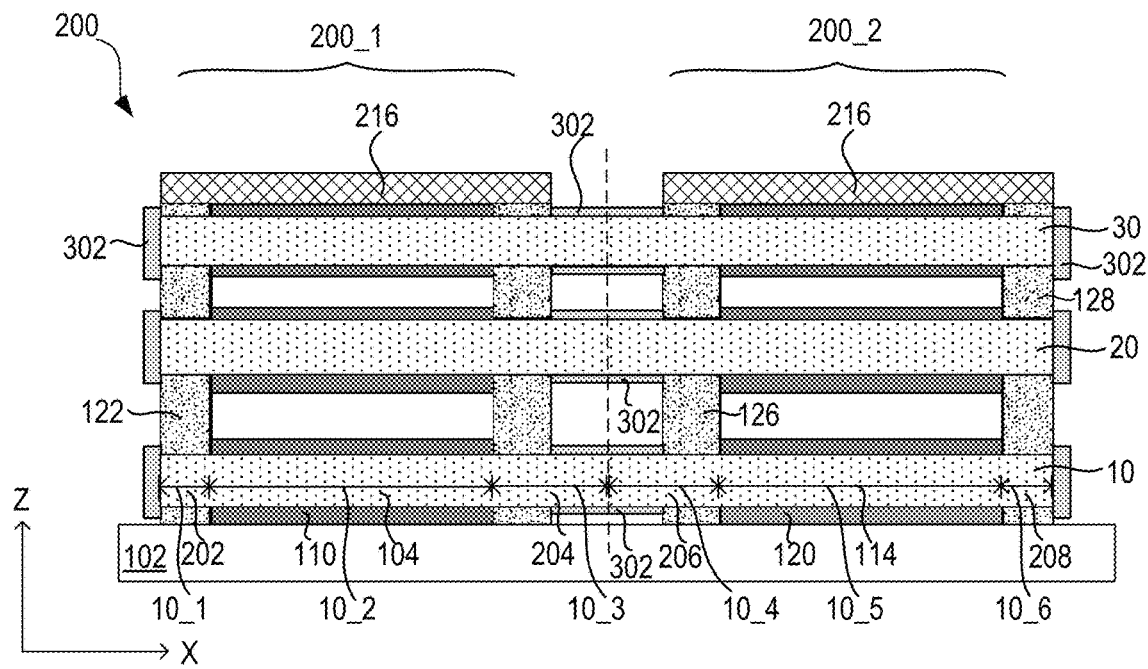

In FIG. 3, protective layers 302 can be selectively deposited on each of the uncovered continuous channels (or continuous channel structures, or connection regions) 10, 20 and 30, and future source/drain regions (e.g., 202 and 208), which gets deposited on both the left stack (e.g., 200_1) and the right stack (200_2). The protective layers 302 can be made of SiO, SiN, or other suitable materials. Any suitable deposition process, such as a chemical vapor deposition (CVD) process, a physical vapor deposition (PVD) process, an atomic layer deposition (ALD), a diffusion process, and a sputtering process, can be applied to form the protective layers 302.

Figure 4:
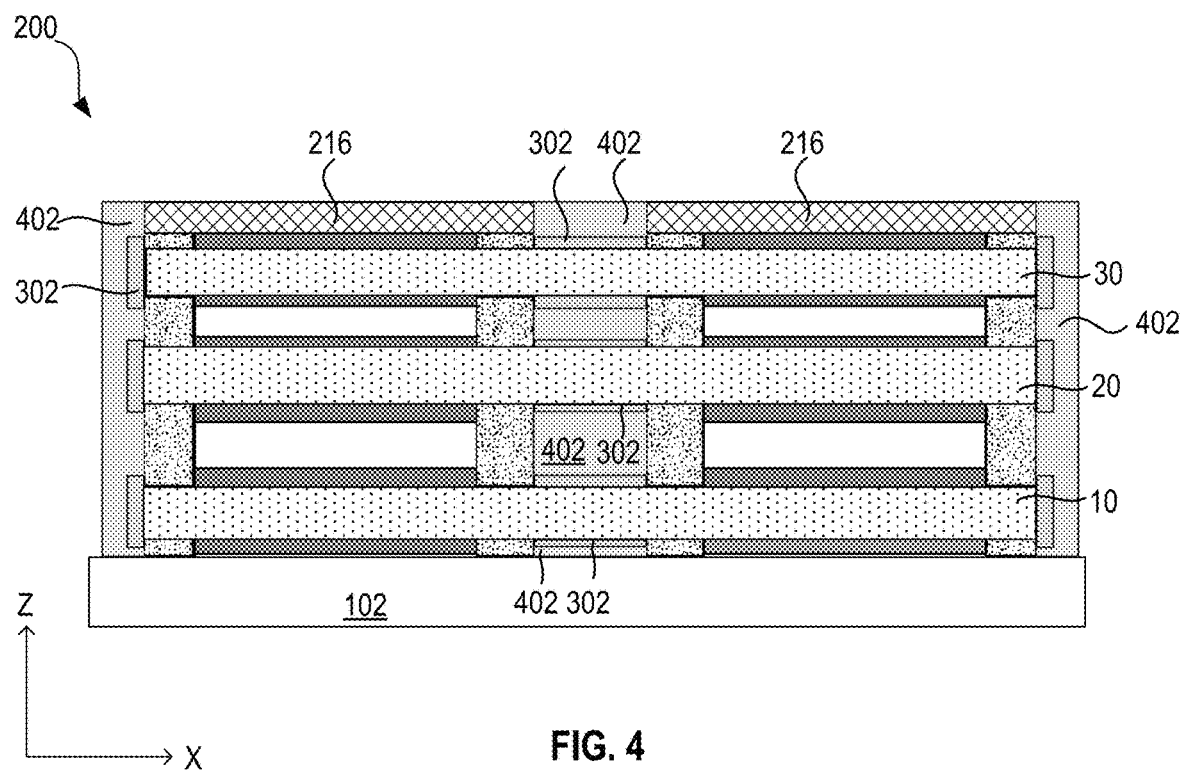

Next, a non-selective oxide deposition (or dielectric deposition) can be executed that fills openings in the stack 200, which can be shown in FIG. 4. The oxide fill can usually result in an overburden positioned over top surfaces of the cap layers 216. Thus the overburden can be removed by a surface planarization process, such as by a chemical-mechanical planarization (CMP) process. The nitride caps (or cap layers) 216 can function as an effective CMP stop layer. When the CMP process is completed, oxide layers 402 can remain in the openings of the stack 200.

Figure 5:
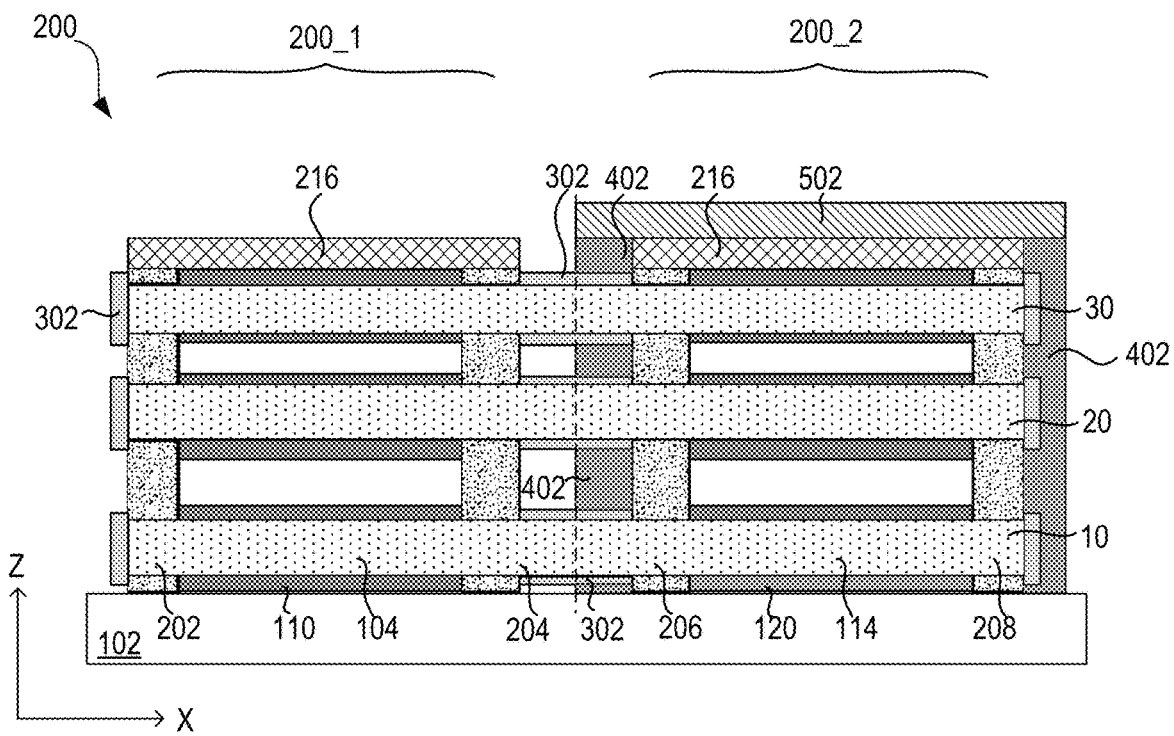

In FIG. 5, the right side of the stack 200 (e.g., stack 200_2) can be masked by a mask layer 502. The mask can further cover first sections of the protective layers 302 and first sections of the oxide layers 402 that are positioned over the p-type future S/D regions (e.g., 206 and 208). A directional etch can be subsequently applied to remove second sections of the non-selective oxide fill (e.g., oxide layers) 402 that are positioned in left side of the stack 200 (e.g., stack 200_1) and disposed over the n-type future S/D regions (e.g., 202, and 204). When the directional etch is completed, second sections of the protective layers 302 that are positioned over the n-type future S/D regions (e.g., 202 and 204) can be uncovered. The direction etch can be a plasma etch that can apply a fluorine based etching gas to remove the second sections of the non-selective oxide fill (e.g., oxide layers) 402 that are position in the left side of the stack 200 (e.g., stack 200_1).

Figure 6:
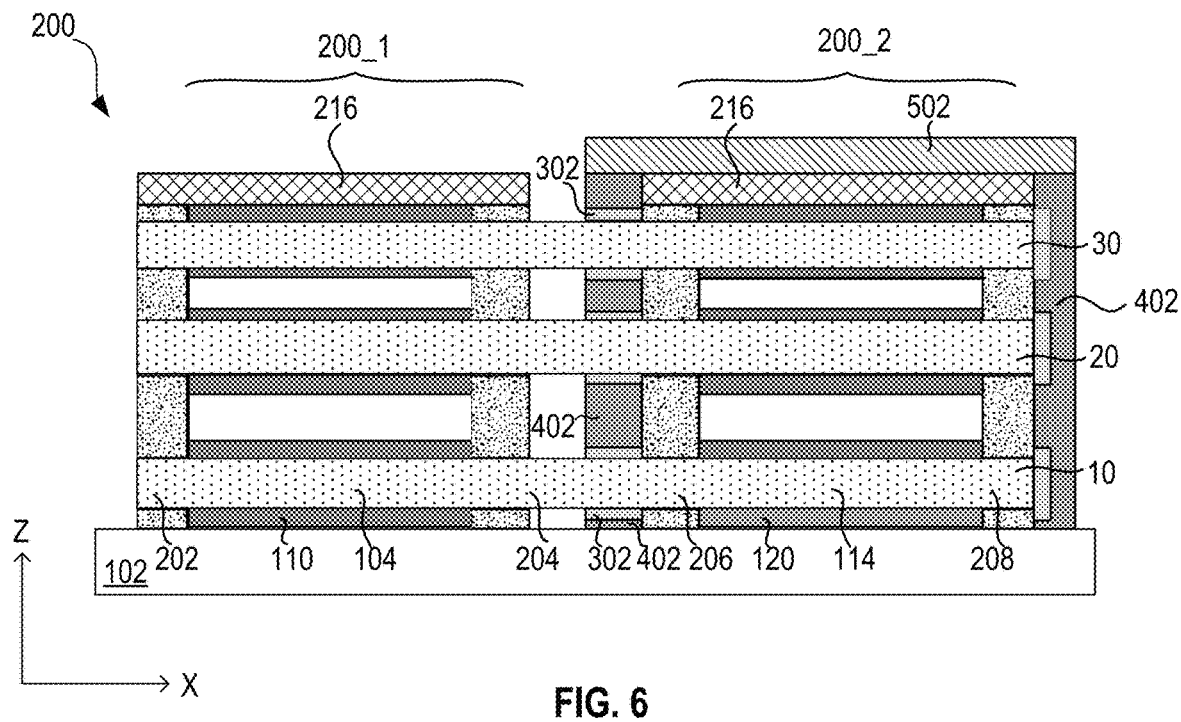

Further, a mostly isotropic etch can be executed to remove the second sections of the selective oxide depositions (e.g., protective layers) 302 that are uncovered by the mask layer 502 and arranged over the n-type future S/D regions (e.g., 202, and 204), which can be shown in FIG. 6. It should be noted that a slight undercut in adjacent regions of the uncovered portions of the continuous channels 10-30 and the n-type future S/D regions (e.g., 202, and 204) may occur. The photoresist etch mask (or mask layer) 502 can optionally be kept on the stack 200_2 during the isotropic etching.

Figure 7:
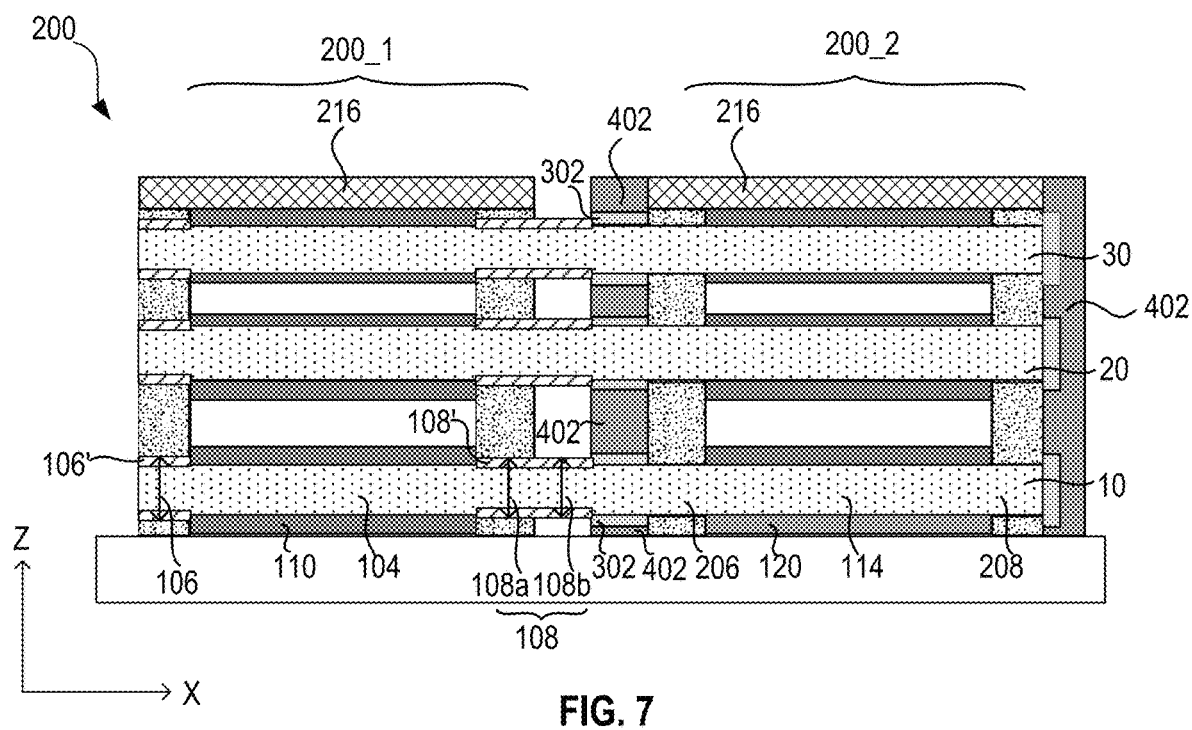

In FIG. 7, the etch mask (or mask layer) 502 can be removed. N+ epitaxial layers can be grown in the n-type future S/D regions of the left stack (e.g., 200_1) for forming the n-type S/D regions for the NMOS transistor devices in the stack 200_1. For example, as shown in FIG. 7, N+ epitaxial layers 106' and 108' can be grown around the n-type future S/D regions 202 and 204 to form the n-type S/D regions 106 and 108 respectively. The growth of the N+ epitaxial layers can include an in-situ doping process, which can introduce n-type dopants, such as phosphorus, during the formation of the epitaxial layers. Accordingly, the epitaxial layers can receive heavy n-type dose level and become the N+ epitaxial layers. In an embodiment, the in-situ doping process can further introduce the n-type dopants at surface regions of the first portions (e.g., 10_1) and third portions (e.g., 10_3) of the continuous channels, which is illustrated in FIG. 7. In another embodiment, the in-situ doping process can further introduce the n-type dopants extend through the first portions (e.g., 10_1) and third portions (e.g., 10_3) of the continuous channels. Thus, the entire first portions (e.g., 10_1) and third portions (e.g., 10_3) of the continuous channels are n-type doped, which can be illustrated in FIG. 17.

When the formation of the N+ epitaxial layers is completed, the n-type S/D regions are formed in the stack 200_1. For example, as shown in FIG. 7, the n-type transistor 200A_1 can have a first n-type S/D region 106, and a second n-type S/D region 108. The second n-type S/D region 108 can further include a first portion 108a that is in direct contact with the n-type channel region 104, and a second portion 108b that can function as a n-type connection region 108b.

Figure 8:
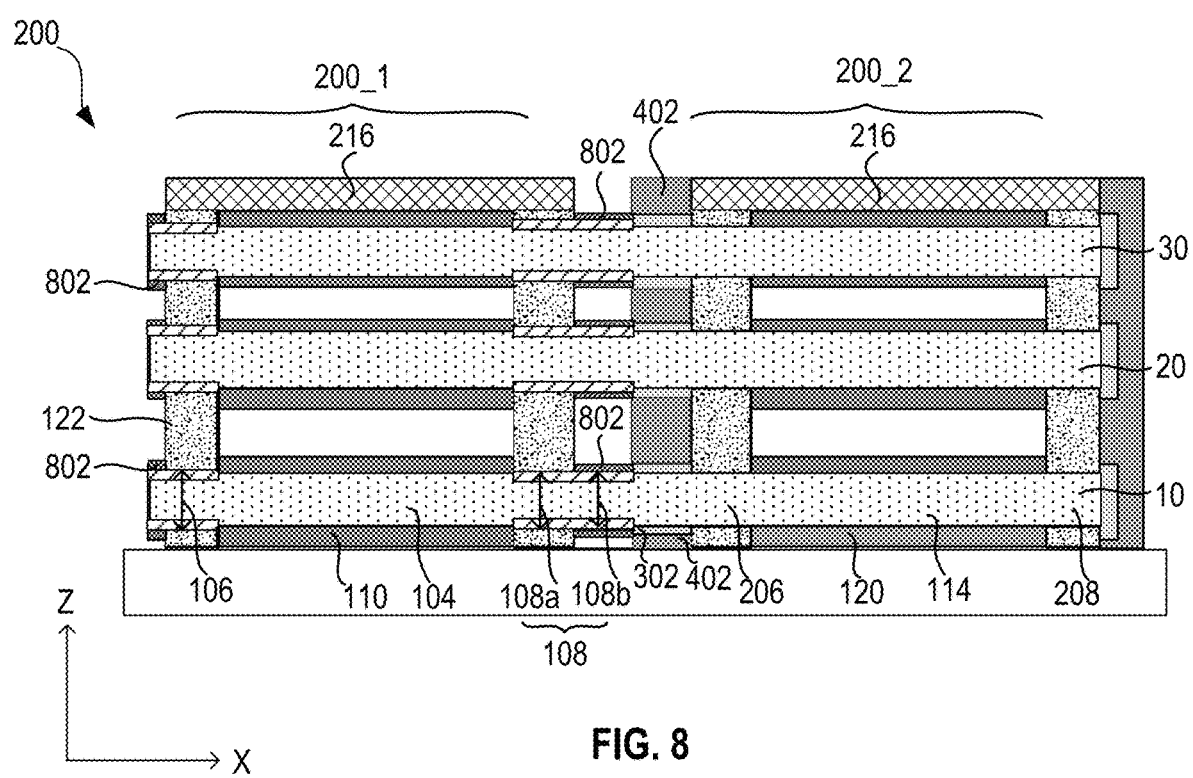

In FIG. 8, a selective nitride deposition can then be executed to protect N+ source/drain regions (or n-type S/D regions) in the stack 200_1. The selective nitride deposition can deposit nitride layers 802 on the N+ S/D regions (e.g., 106, 108) without substantially depositing on remaining materials or adjacent regions (e.g., 216, 122).

Figure 9:
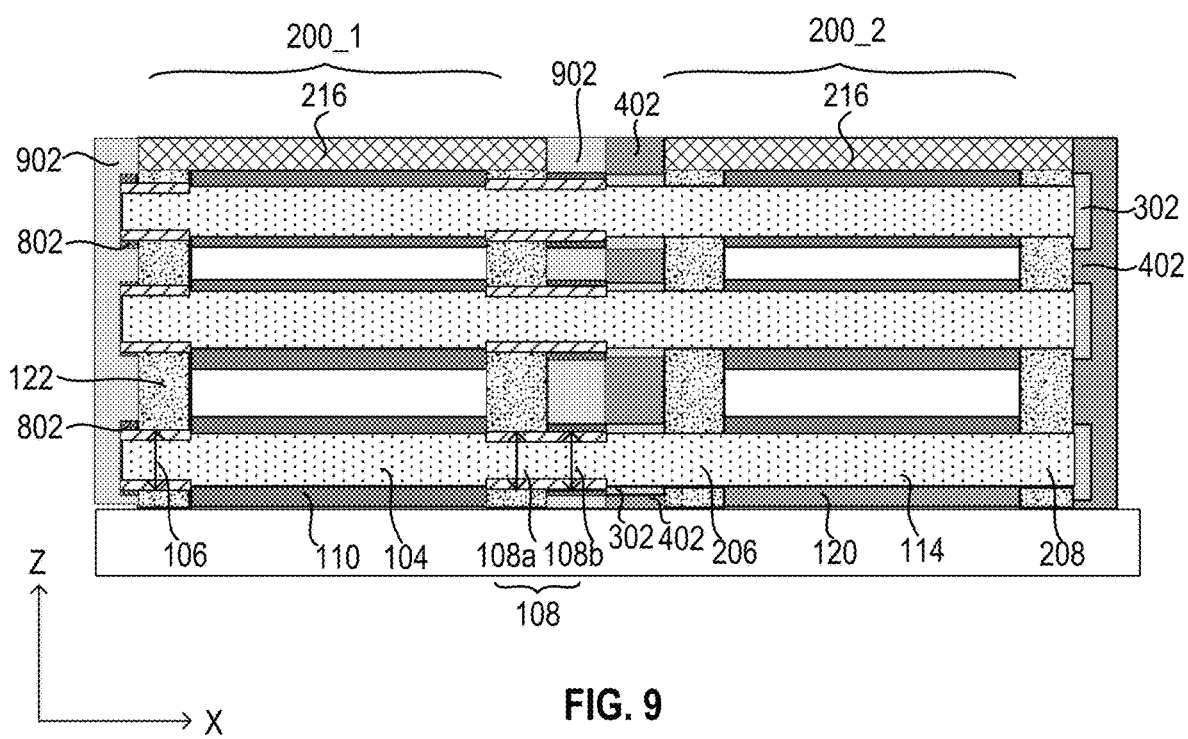

Referring now to FIG. 9, a high-K oxide deposition can be executed to deposit high-K oxide layers 902. The high-K oxide deposition can be non-conformal deposition to fill open spaces in the stack 200_1. For example, the high-k oxide layers 902 can be disposed the n-type S/D regions (e.g., 106 and 108). The high-K oxide deposition can be followed by a CMP process or an etch back process to remove any overburden of the high-K oxide layers 902 down to nitride caps (or cap layers) 216.

Figure 10:
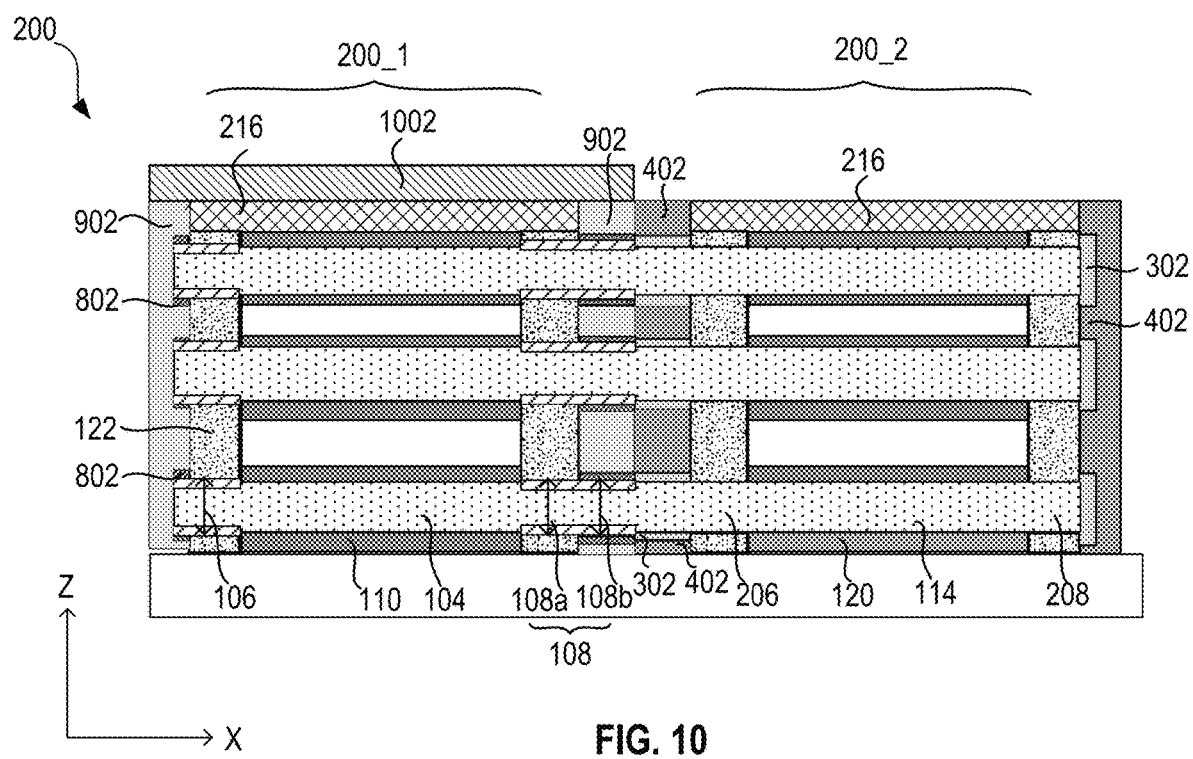

An etch mask 1002 can then be formed on the stack 200_1, which can be shown in FIG. 10. In order to form the etch mask 1002, a lithography process can be applied. The lithography process can include photoresist coating (e.g., spin-on coating), soft baking, mask aligning, exposure, post-exposure baking, photoresist developing, rinsing, drying (e.g., spin-drying and/or hard baking), other suitable lithography techniques, and/or combination thereof.

Figure 11:
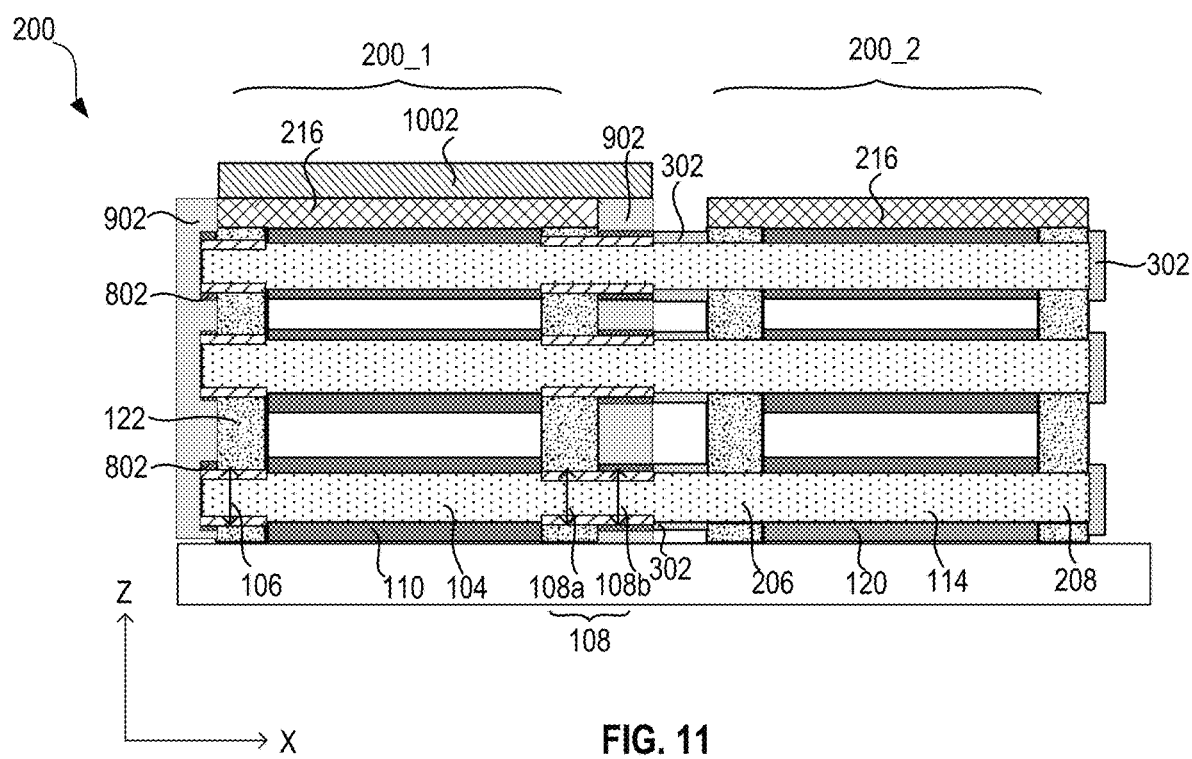
Figure 12:
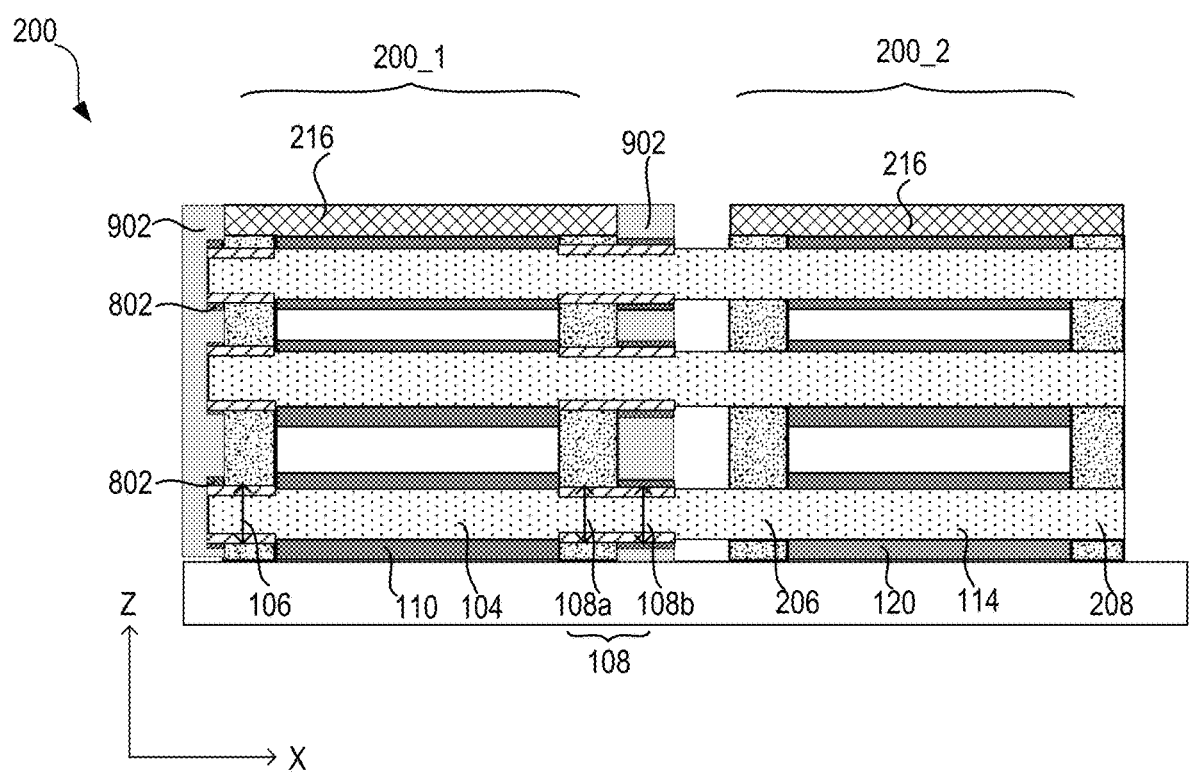

In FIG. 11, an etching process can be applied to remove the first sections of the oxide layers 402 that remain in the stack 200_2 and positioned over the p-type future S/D regions (e.g., 206 and 208), where the etch mask 1002 can be configured to protect the stack 200_1. The etching process can be an anisotropic or directional etching process that can selectively remove the first sections of the oxide layers 402 that remain in the stack 200_2. When the etching process is completed, the first sections of the protective layers 302 that cover the p-type future S/D regions (e.g., 206 and 208) are uncovered.

Further, the first sections of the selective oxide covering (or protective layers) 302 that are positioned on the right stack 200_2 and arranged over the p-type future S/D regions (e.g., 206 and 208) can be removed by through an etching process, such as a plasm etch or a wet etch. When the etching process is completed, the p-type future S/D regions (e.g., 206 and 208) can be uncovered, which can be shown in FIG. 12.

Figure 13:
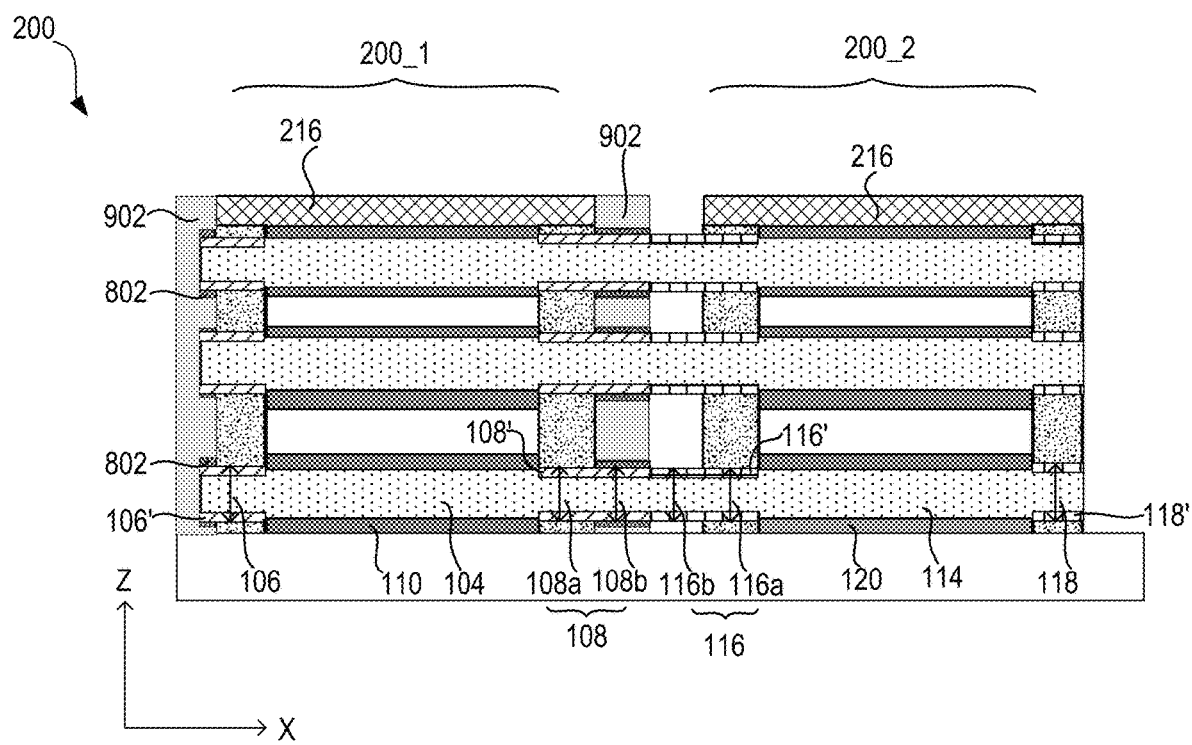

In FIG. 13, P+(p-doped) epitaxial growth can be executed on the PMOS (right) stack (e.g., 200_2) to form the p-type S/D regions. P+ epitaxial layers can be formed in the p-type future S/D regions of the right stack (e.g., 200_2) for forming the p-type S/D regions for the PMOS transistor devices in the stack 200_2. For example, as shown in FIG. 13, P+ epitaxial layers 116' and 118' can be grown around the p-type future S/D regions 206 and 208 to form the p-type S/D regions 116 and 118 respectively. The growth of the P+ epitaxial layers can include an in-situ doping process, which can introduce p-type dopants, such as boron, during the formation of the epitaxial layers. Accordingly, the epitaxial layers can receive heavy p-type dose level and become the P+ epitaxial layers. In an embodiment, the in-situ doping process can further introduce the p-type dopants at surface regions of the fourth portions (e.g., 10_4) and sixth portions (e.g., 10_6) of the continuous channels, which can be illustrated in FIG. 13. In another embodiment, the in-situ doping process can further introduce the p-type dopants extend through the fourth portions (e.g., 10_4) and sixth portions (e.g., 10_6) of the continuous channels. Thus, the entire fourth portions (e.g., 10_4) and sixth portions (e.g., 10_6) of the continuous channels are p-type doped, which can be illustrated in FIG. 17.

When the formation of the P+ epitaxial layers is completed, the p-type S/D regions are formed in the stack 200_2. As shown in FIG. 13, the p-type transistor 200A_2 can have a first p-type S/D region 116, and a second p-type S/D region 118. The first p-type S/D region 116 can include a first portion 116a that is in direct contact with the p-type channel region 114, and a second portion 116b that can function as a p-type connection region 116b that is in direct contact with the n-type connection region 108b.

Figure 14:
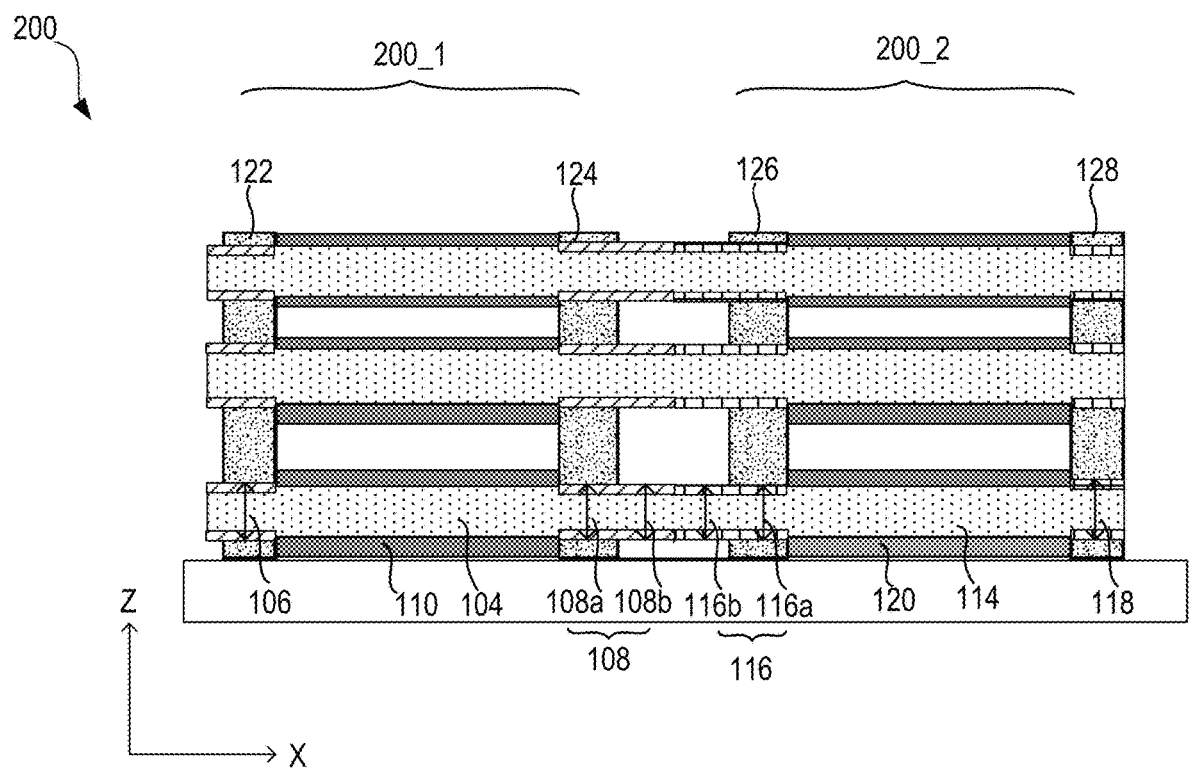

In FIG. 14, the high-k depositions (or high-K oxide layers) 902 and nitride depositions (or nitride layers) 802 that are positioned in stack 200_1 can be removed by an etching process. In addition, the nitride caps (or cap layers) 216 can be removed by the etching process. The etching process can be a dry etching process or a wet etching process that can selectively remove the high-k depositions (or high-K oxide layers) 902 and nitride depositions (or nitride layers) 802. When the etching process is completed, the n-type S/D regions (e.g., 106,108) and the p-type S/D regions (e.g., 116 and 118) can be uncovered.

Figure 15:
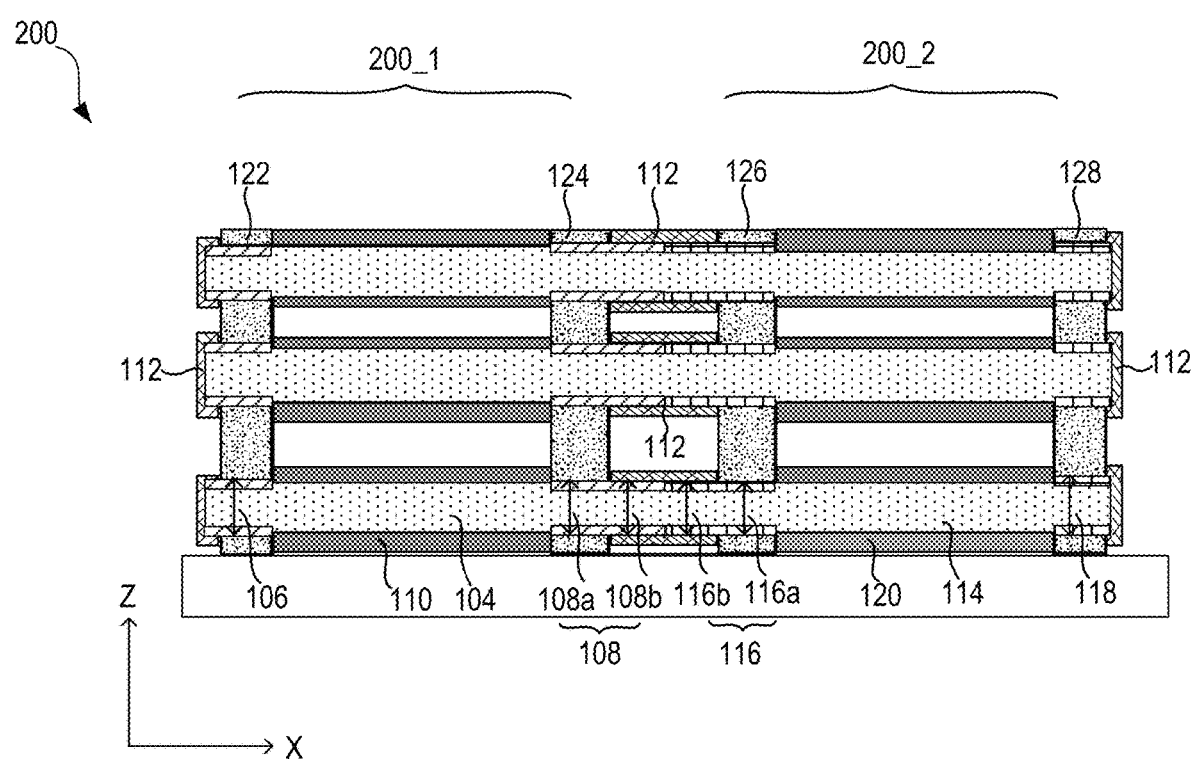

In FIG. 15, a metallization process can be applied on source/drain regions in the stack 200. The metallization process can include a deposition of metal layers on the source/drain regions, and a subsequent annealing. The metal layers can be made of titanium, cobalt or ruthenium. When the annealing is completed, metal silicide layers 112 can be formed to surround the S/D regions in the stack 200. For example, metal silicide layers 112 can be formed to surround the first n-type S/D region 106, the second n-type S/D region 108, the first p-type S/D region 116, and the second p-type S/D region 118. In some embodiments, un-reacted metal can further be removed by an etching process. As shown in FIG. 15, when the metal silicide layers 112 are formed, the n-type channel regions and the p-type channel regions are coupled to each other through the n-type connection regions (e.g., 108b) and the p-type connections (e.g., 116b). Thus continuous channels can be formed between the n-types transistors in stack 200_1 and the p-type transistors in stack 200_2. For example, the n-type channel region 104 of the n-type transistor 200A_1 is coupled to the p-type channel region 114 of the p-type transistor 200A_2 through the second n-type S/D region 108 and the first p-type S/D region 116 that are connected to each other.

Figure 16:
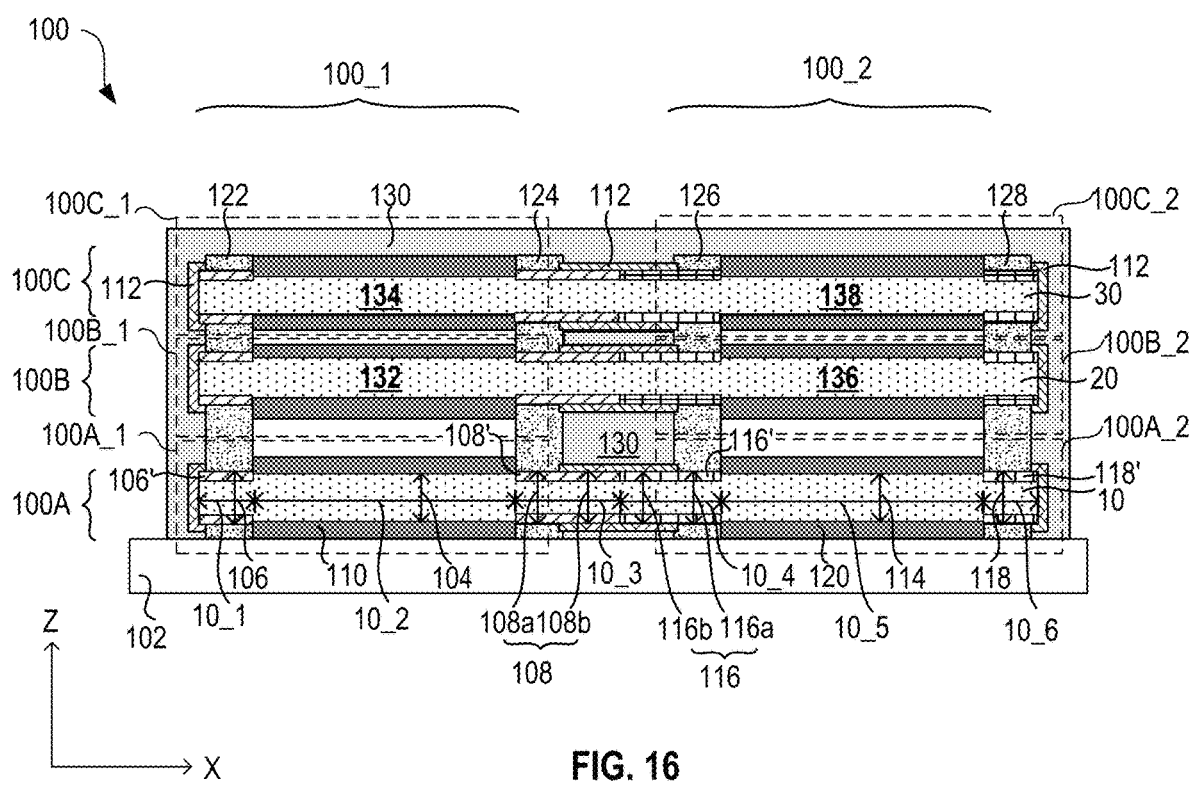

In FIG. 16, an oxide deposition can be applied to fill gaps in the stack 200 with an oxide, such as SiO, SiCO, SiCOH, BPSG, or PSG. For example, the oxide can be deposited to fill the gaps adjacent to the second n-type S/D regions (e.g., 108) and the first p-type S/D regions (e.g., 116). Subsequently, a CMP process can be applied to remove any overburden of the oxide deposition that is over the stack 200.

When the CMP is completed, the oxide remains in the gaps becomes a dielectric layer 130, and a CFET device 100 is subsequently formed. The CFET device 100 can have similar features to the CFET device 100 in FIG. 1. For example, the CFET device 100 can include a stack of NMOS transistors 100_1 and a stack of PMOS transistors 100_2. The stack of NMOS transistors 100_1 and the stack of PMOS transistors 100_2 can be positioned side by side over the substrate 102. The stack of NMOS transistors 100_1 and the stack of PMOS transistors 100_2 can further be coupled to each other through continuous channels (e.g., 10, 20 and 30). Further, the second n-type S/D regions (e.g., 108) of the stack of NMOS transistors 100_1 are in contact with the first p-type S/D regions (e.g., 116) of the stack of PMOS transistors 100_2. The stack of NMOS transistors 100_1 (or stack 100_1) can include a plurality of n-type transistors (e.g., 100A_1, 100B_1, and 100C_1) that are arranged over the substrate 102 in the vertical direction. The stack of PMOS transistors 100_2 (or stack 100_2) can include a plurality of n-type transistors (e.g., 100A_2, 100B_2, and 100C_2) that are arranged over the substrate 102 in the vertical direction.

Figure 17:
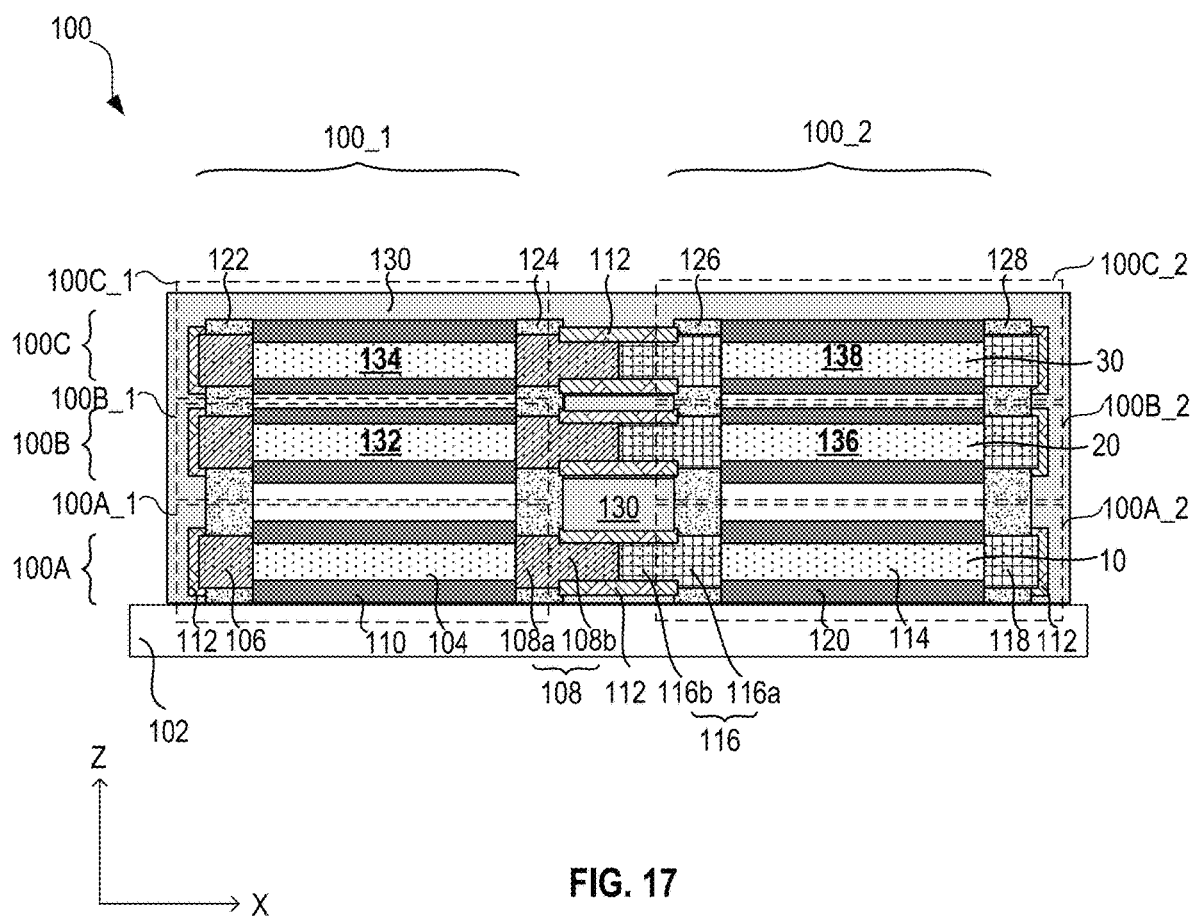
FIG. 17 is a cross-sectional view of a second CFET device, in accordance with some embodiments.

FIG. 17 is another embodiment of the CFET device 100 formed through the methods mentioned above. Compared to the CFET device 100 illustrated in FIG. 1, as shown in FIG. 17, the n-type S/D regions (e.g., 106 and 108) in the stack of NMOS transistors 100_1 can include n-type dopants that extend through the first regions (e.g., 10_1) and the third region s (e.g., 10_3) of the continuous channels 10-30. In addition, the p-type S/D regions (e.g., 116 and 118) in the stack of PMOS transistors 100_2 can include p-type dopants that extend through the fourth regions (e.g., 10_4) and the sixth regions (e.g., 10_6) of the continuous channels 10-30.

It should be noted that additional steps can be executed to complete transistors in the CFET device 100. The additional steps can include future gate (e.g., 110, and 120) removal, work function metal formation, gate cuts, local interconnects and any conductive connections to buried power rail and wiring structures.

The various embodiments described herein offer several advantages over related examples. In the disclosure, continuous channels can be formed between side-by-side field effect transistors (FETs). A continuous channel between a NMOS transistor and a PMOS transistor in a side-by-side configuration can eliminate one connection by shorting the N+ and P+ source/drain (S/D) of the NMOS transistor and the PMOS transistor. Accordingly a more efficient layout can be enabled. In addition, increased S/D areas can be achieved in continuous channel regions. By having combinations of 3D continuous channel and 3D cut channel, optimum 3D logic functions can be achieved.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    a first transistor pair formed over a substrate, the first transistor pair including a first n-type transistor and a first p-type transistor that are arranged along a horizontal direction parallel to the substrate and are positioned side by side; and
    a second transistor pair that is stacked over the first transistor pair, the second transistor pair including a second n-type transistor and a second p-type transistor that are arranged along the horizontal direction and are positioned side by side, wherein:
    the first n-type transistor includes a first n-type source/drain (S/D) region, a first n-type channel region, and a second n-type S/D region that are formed based on a first continuous channel structure extending along the horizontal direction, and are coupled to each other, the first n-type channel region being positioned between the first n-type S/D region and the second n-type S/D region,
    the first p-type transistor includes a first p-type S/D region, a first p-type channel region, and a second p-type S/D region that are formed based on the first continuous channel structure extending along the horizontal direction and coupled to each other, the first p-type channel region being positioned between the first p-type S/D region and the second p-type S/D region,
    the second n-type S/D region of the first n-type transistor is in contact with the first p-type S/D region of the first p-type transistor,
    the second n-type transistor include a third n-type S/D region, a second n-type channel region, and a fourth n-type S/D region that are formed based on a second continuous channel structure extending along the horizontal direction, and are coupled to each other, the second n-type channel region being positioned between the third n-type S/D region and the fourth n-type S/D region, the second p-type transistor include a third p-type S/D region, a second p-type channel region, and a fourth p-type S/D region that are formed based on the second continuous channel structure extending along the horizontal direction, and are coupled to each other, the second p-type channel region being positioned between the third p-type S/D region and the fourth p-type S/D region, and the fourth n-type S/D region of the second n-type transistor is in contact with the third p-type S/D region of the second p-type transistor.

2. The semiconductor device of claim 1, wherein:

the first n-type S/D region is positioned in a first portion of the first continuous channel structure, the first n-type channel region is positioned in a second portion of the first continuous channel structure that is adjacent to the first portion of the first continuous channel structure, the second n-type S/D region is positioned in a third portion of the first continuous channel structure that is adjacent to the second portion of the first continuous channel structure, the first p-type S/D region is positioned in a fourth portion of the first continuous channel structure that is adjacent to the third portion of the first continuous channel structure, the first p-type channel region is positioned in a fifth portion of the first continuous channel structure that is adjacent to the fourth portion of the first continuous channel structure, and the second p-type S/D region is positioned in a sixth portion of the first continuous channel structure that is adjacent to the fifth portion of the first continuous channel structure.

3. The semiconductor device of claim 2, wherein:

the first n-type S/D region includes n-type dopants disposed at a surface region of the first portion of the first continuous channel structure, the second n-type S/D region includes n-type dopants disposed at a surface region of the third portion of the first continuous channel structure, the first p-type S/D region includes p-type dopants disposed at a surface region of the fourth portion of the first continuous channel structure, and the second p-type S/D region includes p-type dopants disposed at a surface region of the sixth portion of the first continuous channel structure.

4. The semiconductor device of claim 2, wherein:

the first n-type S/D region includes n-type dopants extending through the first portion of the first continuous channel structure, the second n-type S/D region includes n-type dopants extending through the third portion of the first continuous channel structure, the first p-type S/D region includes p-type dopants extending through the fourth portion of the first continuous channel structure, and the second p-type S/D region includes p-type dopants extending through the sixth portion of the first continuous channel structure.

5. The semiconductor device of claim 1, further comprising:

a metal silicide layer that surrounds the first n-type S/D region, the second n-type S/D region and, the first p-type S/D region, and the second p-type S/D region.

6. The semiconductor device of claim 1, wherein the first continuous channel structure comprises one of a nanowire and a nanosheet that is arranged along the horizontal direction and extend through the first n-type transistor and the first p-type transistor.

7. The semiconductor device of claim 1, wherein the first n-type transistor further comprises a first n-type gate layer that surrounds the first n-type channel region.

8. The semiconductor device of claim 1, wherein the first p-type transistor further comprises a first p-type gate layer that surrounds the first p-type channel region.

9. The semiconductor device of claim 1, wherein:

the third n-type S/D region is positioned in a first portion of the second continuous channel structure, the second n-type channel region is positioned in a second portion of the second continuous channel structure that is adjacent to the first portion of the second continuous channel structure, the fourth n-type S/D region is positioned in a third portion of the second continuous channel structure that is adjacent to the second portion of the second continuous channel structure, the third p-type S/D region is positioned in a fourth portion of the second continuous channel structure that is adjacent to the third portion of the second continuous channel structure, the second p-type channel region is positioned in a fifth portion of the second continuous channel structure that is adjacent to the fourth portion of the second continuous channel structure, and the fourth p-type S/D region is positioned in a sixth portion of the second continuous channel structure that is adjacent to the fifth portion of the second continuous channel structure.

10. A method of forming a semiconductor device, comprising:

forming a semiconductor structure over a substrate, the semiconductor structure including a first first-type transistor and a first second-type transistor that are arranged along a horizontal direction parallel to the substrate and are positioned side by side, the first first-type transistor including a first first-type future source/drain (S/D) region, a first first-type channel region, and a second first-type future S/D region that are formed based on a first continuous channel structure extending in the horizontal direction sequentially so that the first first-type channel region is positioned between the first first-type future S/D region and the second first-type future S/D region, the first second-type transistor including a first second-type future S/D region, a first second-type channel region, and a second second-type future S/D region that are formed based on the first continuous channel structure extending in the horizontal direction sequentially so that the first second-type channel region is positioned between the first second-type future SD region and the second second-type future S/D region, the second first-type future S/D region being in contact with the first second-type future S/D region;

growing a first material around the first first-type future S/D region and the second first-type future S/D region to form a first first-type S/D region and a second first-type SD region respectively; and growing a second material around the first second-type future S/D region and the second second-type future S/D region to form a first second-type S/D region and a second second-type S/D region respectively, wherein the second first-type S/D region being in contact with the first second-type S/D region, wherein the growing the first material further comprises:

forming a first dielectric layer to cover the second first-type future S/D region of the first first-type transistor and the first second-type future S/D region of the first second-type transistor;

forming a second dielectric layer to cover the first dielectric layer;

forming a mask layer to cover the first second-type transistor, a first section of the second dielectric layer and a first section of the first dielectric layer that are disposed over the first second-type future S/D region;

removing a second section of the first dielectric layer and a second section of the second dielectric layer that are positioned over the second first-type future S/D region to uncover the second first-type future S/D region; and growing the N+ material around the second first-type future S/D region to form the second first-type S/D region.

11. The method of claim 10, wherein the growing the second material further comprises:

forming a third dielectric layer to cover the second first-type S/D region;

forming a mask layer to cover the first first-type transistor and the third dielectric layer so that the first section of the second dielectric layer is uncovered;

removing the first section of the first dielectric layer and the first section of the second dielectric layer to uncover the first second-type future S/D region; and growing the second material around the first second-type future S/D region to form the first second-type S/D region.

12. The method of claim 11, further comprising:

forming a metal silicide layer that surrounds the first first-type S/D region, the second first-type S/D region and, the first second-type S/D region, and the second second-type S/D region.

13. The method of claim 12, further comprising:

forming a second first-type transistor and a second second-type transistor over the first first-type transistor and the first second-type transistor, the second first-type transistor and the second second-type transistor being arranged along the horizontal direction and are positioned side by side, the second first-type transistor including a third first-type future S/D region, a second first-type channel region, and a fourth first-type future S/D region that are formed based on a second continuous channel structure extending in the horizontal direction sequentially so that the second first-type channel region is positioned between the third first-type future S/D region and the fourth first-type future S/D region, the second second-type transistor including a third second-type future S/D region, a second second-type channel region, and a fourth second-type future S/D region that are formed based on the second continuous channel structure extending in the horizontal direction sequentially so that the second second-type channel region is positioned between the third second-type future S/D region and the fourth second-type future S/D region; and growing the first material around the third first-type future SD region and the fourth first-type future S/D region to form a third first-type S/D region and a fourth first-type S/D region respectively; and growing the second material around the third second-type future S/D region and the fourth second-type future S/D region to form a third second-type S/D region and a fourth second-type S/D region respectively, wherein the fourth first-type S/D region being in contact with the third second-type S/D region.

14. A semiconductor device, comprising:

a stack of NMOS transistor devices that are positioned over a substrate in a vertical direction perpendicular to the substrate, and spaced apart from one another, a first NMOS transistor device of the stack of NMOS transistor devices including a first n-type source/drain (S/D) region, a first n-type channel region, and a second n-type S/D region that are formed based on a first continuous channel structure extending in a horizontal direction parallel to the substrate, the first n-type channel region is positioned between the first n-type S/D region and the second n-type S/D region; and a stack of PMOS transistor devices that are positioned over the substrate in the vertical direction, and spaced apart from one another, a first PMOS transistor device of the stack of PMOS transistor devices including a first p-type source/drain (S/D) region, a first p-type channel region, and a second p-type S/D region that are formed based on the first continuous channel structure extending in the horizontal direction, the first p-type channel region is positioned between the first p-type S/D region and the second p-type S/D region, wherein:

the stack of NMOS transistor devices are positioned adjacent to the stack of PMOS transistor devices, and the second n-type S/D region is in contact with the first p-type S/D region.

15. The semiconductor device of claim 14, wherein:

the stack of NMOS transistor devices further includes a second NMOS transistor device that is positioned over the first NMOS transistor device;

the stack of PMOS transistor devices further comprises a second PMOS transistor device that is positioned over the first PMOS transistor device;

the second NMOS transistor device includes a third n-type S/D region, a second n-type channel region, and a fourth n-type S/D region that are formed based on a second continuous channel structure extending in the horizontal direction, the second n-type channel region being positioned between the third n-type S/D region and the fourth n-type S/D region;

the second PMOS transistor device includes a third p-type S/D region, a second p-type channel region, and a fourth p-type S/D region that are formed based on the second continuous channel structure extending in the horizontal direction sequentially, the second p-type channel region being positioned between the third p-type S/D region and the fourth p-type S/D region; and the fourth n-type S/D region of the second NMOS transistor device is in contact with the third p-type S/D region of the second PMOS transistor device.

16. The semiconductor device of claim 14, wherein:

the first n-type S/D region is positioned in a first portion of the first continuous channel structure, the first n-type channel region is positioned in a second portion of the first continuous channel structure that is adjacent to the first portion of the first continuous channel structure, the second n-type S/D region is positioned in a third portion of the first continuous channel structure that is adjacent to the second portion of the first continuous channel structure, the first p-type S/D region is positioned in a fourth portion of the first continuous channel structure that is adjacent to the third portion of the first continuous channel structure, the first p-type channel region is positioned in a fifth portion of the first continuous channel structure that is adjacent to the fourth portion of the first continuous channel structure, and the second p-type S/D region is positioned in a sixth portion of the first continuous channel structure that is adjacent to the fifth portion of the first continuous channel structure.

17. The semiconductor device of claim 16, wherein:

the first n-type S/D region includes n-type dopants disposed at a surface region of the first portion of the first continuous channel structure, the second n-type S/D region includes n-type dopants disposed at a surface region of the third portion of the first continuous channel structure, the first p-type S/D region includes p-type dopants disposed at a surface region of the fourth portion of the first continuous channel structure, and the second p-type S/D region includes p-type dopants disposed at a surface region of the sixth portion of the first continuous channel structure.

18. The semiconductor device of claim 16, wherein:

the first n-type S/D region includes n-type dopants extending through the first portion of the first continuous channel structure, the second n-type S/D region includes n-type dopants extending through the third portion of the first continuous channel structure, the first p-type S/D region includes p-type dopants extending through the fourth portion of the first continuous channel structure, and the second p-type S/D region includes p-type dopants extending through the sixth portion of the first continuous channel structure.

\* \* \* \* \*